United States Patent [19]

Kallio

[11] 3,810,157

[45] May 7, 1974

[54] BIPOLAR DIGITAL-TO-ANALOG CONVERTER

[75] Inventor: Frank H. Kallio, Anchorage, Alaska

[73] Assignee: Sperry Rand Corporation, New York, N.Y.

[22] Filed: Feb. 14, 1972

[21] Appl. No.: 225,794

[52] U.S. Cl. .......... 340/347 DA
[51] Int. Cl. .......... H03k 13/14
[58] Field of Search .......... 340/347 DA, 347 AD

[56] References Cited

UNITED STATES PATENTS

| | | | |
|---|---|---|---|
| 3,495,235 | 2/1970 | Ottesen | 340/347 AD |
| 3,505,668 | 4/1970 | Ottesen | 340/347 AD |
| 3,582,939 | 6/1971 | Campbell | 340/347 DA |
| 3,665,460 | 5/1972 | Murakami et al. | 340/347 DA |
| 3,678,504 | 7/1972 | Kaneko | 340/347 DA |
| 3,396,380 | 8/1968 | Ohashi | 340/347 DA |

*Primary Examiner*—Thomas A. Robinson
*Attorney, Agent, or Firm*—Howard P. Terry; Samuel C. Yeaton

[57] ABSTRACT

A digital-to-analog converter for transforming signed binary numbers to analog form comprises a plurality of single pole-double throw switches having first contacts commonly connected to a source of reference potential and second contacts commonly connected to ground potential. The positions of the wipers of the switches are controlled by the respective digits of the number to be converted. The wipers of the switches associated with the magnitude digits of the number to be converted are connected to an R-2R resistance ladder network. The output of the resistance ladder network is connected as an input to a differential amplifier capable of operating in an inverting or non-inverting mode. The other input of the differential amplifier is resistively coupled to the wiper of the switch associated with the sign digit of the number to be converted whereby the output of the differential amplifier provides an analog signal of polarity and magnitude representative of the signed binary number to be converted.

6 Claims, 2 Drawing Figures

BIPOLAR DIGITAL-TO-ANALOG CONVERTER

BACKGROUND OF THE INVENTION

1. Field of the Invention

The invention pertains to digital-to-analog converters particularly of the type for converting signed digital numbers to bipolar analog signals.

2. Description of the Prior Art

Digital-to-analog converters are well known in the prior art where the digits of the number to be converted control a plurality of single pole-double throw switches, respectively, for selectively connecting reference potentials to a ladder network whose output provides the corresponding analog signal. A type of ladder network commonly utilized in such converters is the well known R–2R resistance ladder network which is conveniently commercially procurable in modular form from numerous manufacturers of electronic circuit components. The plurality of switches utilized in such converters are normally instrumented by solid state switching devices also commercially procurable in modular form as ladder switch modules from manufacturers of electronic circuit components. Such ladder switch modules are normally provided with one contact of each of the switches connected to a common bus terminating at an input connector to the module. The other contact of the switches are normally commonly connected to another bus which terminates at another input connector to the module. Such switch modules normally provide input terminals to control the positioning of the switches, respectively, and output terminals associated with the wipers of the respective switches are also normally provided.

It is therefore appreciated that a convenient present-day method for constructing digital-to-analog converters is to procure an appropriate resistance ladder network module and an appropriate ladder switch module interconnecting the two to form the converter. It is normally desirable in present-day data handling or control systems to convert signed digital numbers to corresponding bipolar analog signals. One prior art configuration for instrumenting such bipolar converters is to utilize a matched pair of precision power supplies providing positive and negative reference potentials and connected to the two contact buses of the ladder switch module respectively. The precision reference power supplies of such converters represent a substantial portion of the cost thereof. Therefore, in bipolar converters the necessity of having two such expensive power supplies unduly increases the cost of such converters. Additionally, the two required power supplies unduly increase the bulk and weight of the converter which may impose severe design limitations in, for example, airborne environments. It is further appreciated that the precision power supplies are extremely difficult to design for proper operation over the wide temperature ranges often encountered in numerous converter environments.

Another prior art bipolar digital-to-analog converter configuration involves grounding one of the contact buses of the ladder switch module and connecting the other contact bus through a separate single pole-double throw switch to the two precision reference power supplies; the separate switch being controllec by the sign digit of the number to be converted. This arrangement not only suffers from the disadvantage of requiring two precision power supplies, as previously discussed, but additionally requires a separate switch with contacts connected to the two supplies, respectively. This arrangement precludes using one of the switches of the ladder switch module for this purpose because of the common busing of the switch contacts thereof as previously discussed.

Another prior art bipolar digital-to-analog converter arrangement involves connecting the output of the ladder network to a differential output device with the differential outputs thereof connected to the contacts of a separate single pole-double throw switch, the switch being controlled by the sign digit of the number to be converted. This arrangement has the disadvantage of requiring an additional switch since the switches of the ladder switch module cannot be used for this purpose for the reasons discussed above. Additionally, the differential output device required in this arrangement is subject to differential unbalance which decreases the efficacious operation of the converter.

SUMMARY OF THE INVENTION

The invention provides a digital-to-analog converter for transforming signed binary numbers to bipolar analog output signals where only one precision reference power supply is required. Additionally, the polarity of the output is determined by a single pole-double throw switch controlled by the sign digit of the number to be converted where the contacts thereof are connected to the contact buses of the ladder switch module, respectively, thus permitting this switch to be included therein. The converter comprises a plurality of single pole-double throw switches, the contacts thereof being connected to two contact buses respectively. A precision power supply is connected to one of the buses and the other bus is connected to ground potential. The digits of the number to be converted are utiliized, respectively, to control the positioning of the switches. The switches associated with the magnitude digits of the number are connected to an impedance ladder network, the output of which being connected as an input to an inverting circuit. The other input to the inverting circuit is resistively coupled to the switch associated with the sign digit of the number to be converted. Thus, the output of the inverting circuit provides an analog signal of polarity and magnitude representative of the signed digital number to be converted.

DESCRIPTION OF THE PREFERRED EMBODIMENTS

Figures 1, 2:
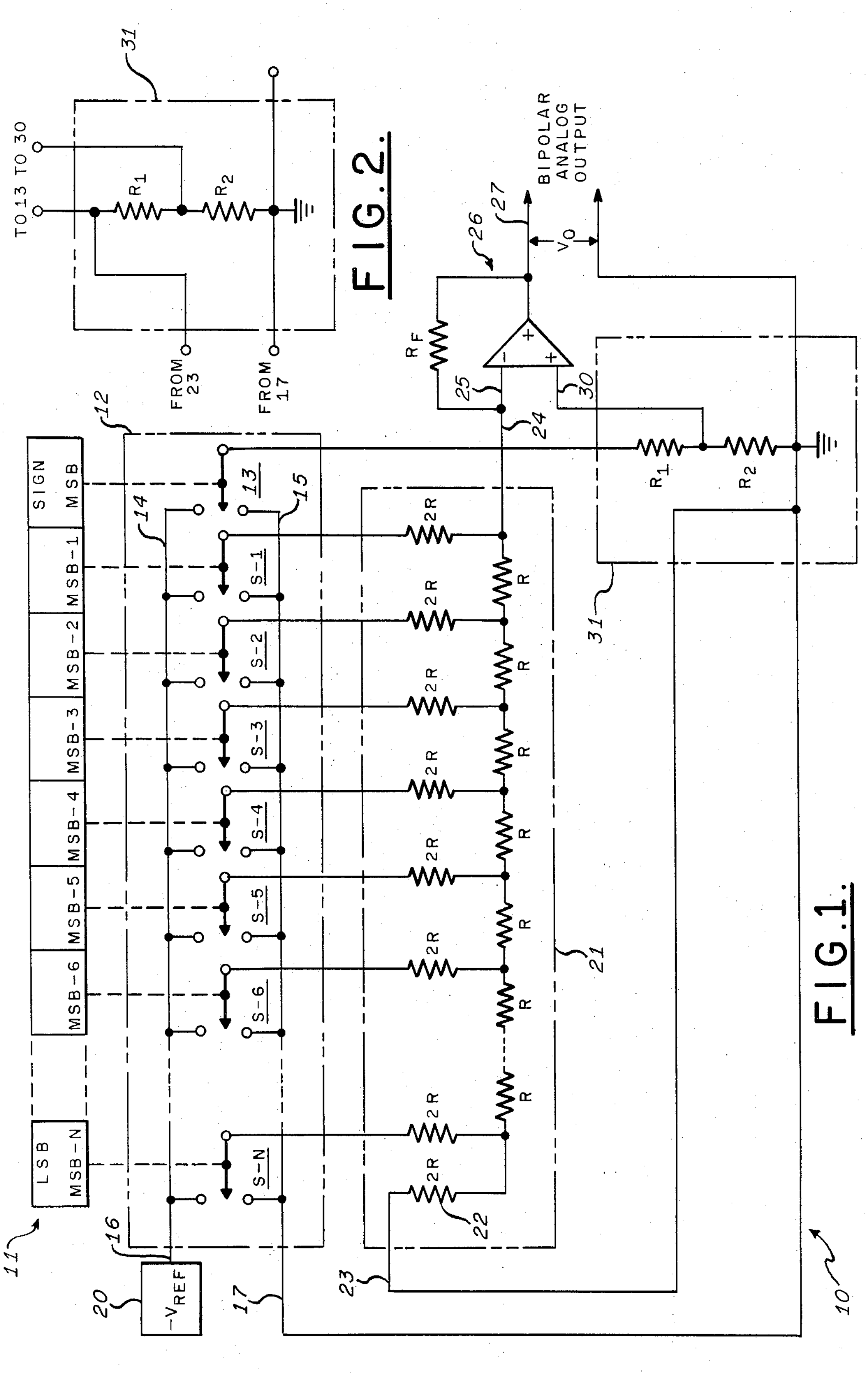
FIG. 1 is a schematic wiring diagram of a bipolar digital-to-analog converter configured in accordance with the invention.
FIG. 2 is a schematic wiring diagram illustrating an alternative arrangement for a portion of FIG. 1.

Referring to FIG. 1, a digital-to-analog converter 10 for transforming signed binary numbers to bipolar analog signals is illustrated, instrumented in accordance with the concepts of the present invention. The converter 10 includes a register 11 for holding the signed binary number to be converted. The register 11 consists of a plurality of stages for holding the respective digits of the number. The stages of the register 11 are designated as MSB, MSB–1 . . . , MSB-N, respectively, where MSB designates most significant bit. Conventionally, the most significant bit of a signed binary number is representative of the sign thereof and the MSB-N position is normally the least significant bit (LSB) of the number. Conventionally, in binary number systems, a sign digit of binary ZERO is representative of a positive number and a sign digit of binary ONE is representative of a negative number. The number to be converted and stored in the register 11 may be expressed by a wide variety of number representations such as conventional 2's complement, 1's complement, signed magnitude coding and the like.

The converter 10 further includes a plurality of single pole-double throw switches 12 consisting of a switch 13 associated with the sign stage of the register 11 and switches S–1 to S–N associated with the remaining stages of the register 11, respectively. One contact of each of the switches 12 is commonly connected to a contact bus 14 and the other contact of each of the switches 12 is commonly connected to another contact bus 15. The wipers of the switches 12 are controlled, respectively, by the outputs of the stages of the register 11 such that when a stage of the register 11 stores a binary ZERO, the wiper of the associated switch is connected to the bus 15, and when a stage of the register 11 stores a binary ONE, the wiper of the associated switch is connected to the bus 14. In practice, the switches 12 are normally instrumented by solid state switches with electrical control leads connected to the respective electrical outputs of the stages of the register 11. In fact, the switches 12 may be readily commercially procured as a ladder switch module in encapsulated or integrated circuit form. The wiring illustrated within the box 12 as well as the control leads therein are internal to the module 12, access being had to the buses 14 and 15 through input leads 16 and 17, respectively.

The bus 14 of the ladder switch module 12 is connected via the lead 16 to a precision power supply 20 for providing an accurate and stable negative voltage designated as $-V_{REF}$. The bus 15 of the ladder switch module 12 is connected to ground potential via the lead 17.

The digital-to-analog converter 10 further includes a conventional R–2R resistance ladder network 21. The ladder network 21 includes a plurality of series arms each having a resistance of R and a plurality of parallel legs each having a resistance of 2R. One of the 2R resistors 22 provides a termination for the ladder network 21 on a lead 23. All of the 2R resistors with the exception of the termination resistor 22, are electrically connected to the wipers of the switches S–1 through S–N, respectively. The output of the ladder network 21 is provided on a lead 24. It will be appreciated that the resistance ladder network 21 may be readily, commercially procured as a resistor ladder network module in encapsulated or integrated circuit form.

The principle of operation of the combination comprising the stages MSB–1 through MSB–N of the register 11, the switches S–1 through S–N of the switch module 12 and the ladder network module 21 is well known. Briefly the current applied to the lead 24 is a function of the stage of the switches S–1 through S–N. The current applied to the lead 24 by moving the wiper of the switch S–2 from the ground position to the power supply position is one-half of the current applied to the lead 24 by moving the wiper of the switch S–1 from the ground position to the power supply position. In general, each switch has one-half the effect of the preceding switch starting at the switch S–1. As previously explained, a binary ONE stored in a particular stage of the register 11 causes the wiper of the associated switch to move from the ground position to the power supply position and since the effect of each switch is one-half the effect of the preceding switch, the bits of the number stored in the stages MSB–1 through MSB–N of the register 11 that control the operation of the switches S–1 through S–N, respectively, is the binary representation of the analog current applied to the lead 24 by the ladder network 21.

The current applied to the lead 24 by the ladder network 21 is additionally modified by the connection of the termination resistor 22 via the lead 23.

The output lead 24 of the ladder network 21 is connected to an input 25 of a differential input operational amplifier 26. The output 27 of the amplifier 26 is connected to its input 25 via a feedback resistor $R_F$. The wiper of the switch 13 is connected to ground via serially connected resistors $R_1$ and $R_2$. The junction between resistors $R_1$ and $R_2$ is connected to the second input 30 of the amplifier 26. In the embodiment of the invention illustrated in FIG. 1, the termination resistor 22 of the ladder network 21 is connected to ground via the lead 23 as illustrated in the dashed box 31.

It will be appreciated from the foregoing that the converter 10 utilizes the sign bit of the number to be converted as stored in the register 11 to control the operational amplifier 26 via the switch 13 and the resistors $R_1$ and $R_2$ to function in either an inverting or a non-inverting mode in accordance with the position of the wiper of the switch 13. When the sign bit is binary ZERO, representing a positive quantity, the wiper of the switch 13 is connected to ground via the bus 15 thus causing the amplifier 26 to operate in its inverting mode. When, however, the sign digit is binary ONE, designating a negative number, the wiper of the switch 13 is positioned to the reference power supply 20 via the bus 14 causing the amplifier 26 to operate in its inverting, non-inverting mode. Thus, it is appreciated that the connections to the switch 13 are compatible with the remainder of the ladder switches 12, thus permitting the switch 13 to be included in the ladder switch module 12.

The converter 10 of FIG. 1 may be utilized for transforming binary signed 2's complement numbers stored in the register 11 to corresponding bipolar analog signals at the output 27. In order to so utilize the converter 10, the values of the resistors $R_1$ and $R_2$ should be chosen equal to each other so as to effect a voltage division by 2 at the non-inverting input. For minimum offset and drift, the optimum choice of values for the resistors $R_1$ and $R_2$ is to design them each equal to the resistance R. In the configuration described, the value of the feedback resistor $R_F$ may be chosen equal to the resistance value R. Utilizing these resistance values may effect an economy of design since many commercially available ladder network modules include additional R and 2R resistors therein for this purpose.

It will be appreciated from routine network analysis, that when the optimum values of $R_1=R_2=R_F=R$ are utilized, as mentioned above, the amplifier 26 has unity gain. Network analysis further indicates that for the amplifier 26 to have a gain of 2, optimum resistance values are $R_2=R_F=2R$ and $R_1=R$.

The output equation for the converter 10, when utilized for binary signed 2's complement number conversions and with $R_1=R_2$, may be given by $V_o= -\text{VREF}[\text{MSB}- \frac{1}{2}(\text{MSB}-1) - \frac{1}{4}(\text{MSB}-2) - \frac{1}{8}(\text{MSB}-3) - \ldots - 2^{-N}(\text{MSB}-N)]$ The converter 10 as illustrated in FIG. 1 may also be utilized for the transformation of binary signed 1's complement numbers. Typically the 1's complement code utilizes plus and minus zero, i.e., all bits ZERO and all bits ONE, respectively, as mathematical zero. For binary signed 1's complement number conversions, the resistors $R_1$ and $R_2$ should be chosen such that $$R_2/R_1+R_2=2^N-1/2^N+1$$

It will be apprecicated that this 1's complement embodiment may be somewhat more expensive to instrument than the previously described 2's complement embodiment since, normally, the resistance values of $R_1$ and $R_2$ chosen to satisfy the given relationship will not be equal to R or 2R. Thus separate resistors will be required unlike the 2's complement embodiment described above where $R_1$ and $R_2$ may be included within the resistance ladder network module 21.

The binary signed 2's complement number converter described above may also be utilized for converting binary signed 1's complement numbers by connecting the termination resistors 22 of the ladder network 21 to the wiper of the switch 13 rather than to ground as illustrated in FIG. 1. This connection for the 1's complement embodiment is illustrated in FIG. 2. The output equation for this 1's complement embodiment is given as follows:

$$V_o= -\text{VREF}[2^N-1/2^N(\text{MSB}) - \frac{1}{2}(\text{MSB}-1) - \frac{1}{4}(\text{MSB}-2) - \frac{1}{8}(\text{MSB}-3) - \ldots - 2^{-N}(\text{MSB}-N)]$$

The 1's complement embodiment as described above with the connection as shown in FIG. 2 may be modified to accept signed magnitude binary coding by connecting the input digits MSB–1 through LSB to respective exclusive OR gates, each gate deriving its second input from the sign stage of the register 11. The outputs of these exclusive OR gates are then utilized to control the switches S–1 through S–N, respectively.

Similarly, other digital input codings may be utilized by employing appropriate digital input modifications, termination changes and different ladder network configurations. Such converters may provide bipolar outputs from a single reference power supply by connecting the ladder output to the inverting input of the differential input operational amplifier 26 and using the sign digit to connect a ratio of the reference voltage to the non-inverting input thereof.

For the d.c. operation of the device as described above, the output signal appears between the output 27 of the amplifier 26 and ground in the preferred embodiment. It will be appreciated, however, that the electrical common referred to as ground may in general be raised to any potential while the output signal will still exist as described above between the common and the amplifier output. Thus, herein and for the purposes of the appended claims, the term "ground" is understood to refer to signal or chassis ground of the device which may in some instances differ from "earth" potential.

It will be appreciated that an a.c. reference voltage may be utilized instead of a d.c. reference voltage since the above equations apply to a.c. signals as well as to d.c. signals. For an a.c. signal embodiment, however, the output voltage corresponding to a negative number will be an a.c. voltage 180° out of phase with the system a.c. reference. The switches for an a.c. application must be capable of switching the a.c. signals as well as biased a.c. signals. The ground or common referred to herein is understood to refer to signal ground for a.c. operation as well as for the d.c. operation described above.

It will furthermore be appreciated that once the principles of the present invention are understood, routine circuit analysis may be utilized to derive values for the resistors $R_1$, $R_2$ and $R_F$ different from those given above, in combination with the connection of the termination resistor 22, to provide additional embodiments of the invention for different purposes.

Although the above embodiments of the invention were explained in terms of resistance ladder network, it will be appreciated that generally an impedance ladder network may be utilized in accordance with the type of signals employed in the system.

While the invention has been described in its preferred embodiments, it is to be understood that the words which have been used are words of description rather than limitation and that changes may be made within the purview of the appended claims without departing from the true scope and spirit of the invention in its broader aspects.

I claim:

1. A digital-to-analog converter responsive to the digits of the number to be converted, said digits of said number comprising magnitude digits and a sign digit, the combination comprising power supply means for providing a reference potential, a source of ground potential, a plurality of switch means coupled to said power supply means and said source of ground potential and responsive to said digits of said number respectively for selective connection to either said reference potential or ground potential in accordance with the values of said digits, respectively, impedance ladder network means coupled to said switch means associated with said magnitude digits, and inverting circuit means coupled to said impedance ladder network means and said switch means associated with said sign digit for selectively inverting or not inverting the output of said impedance ladder network means in accordance with said sign digit to provide at the output of said inverting circuit means an analog signal of polarity and magnitude representative of said number.

2. The converter of claim 1 in which said power supply means comprises a source of d.c. reference potential, and said impedance ladder network means comprises an R–2R resistance ladder network.

3. The converter of claim 1 in which said inverting circuit means comprises a differential circuit having two inputs and an output for providing at said output the difference between the signals applied at said two inputs, respectively, one of said inputs being coupled to said impedance ladder network means and the other of said inputs being coupled to said switch means associated with said sign digit, whereby said output provides said analog signal.

4. The converter of claim 3 in which said impedance ladder network means comprises an R–2R resistance ladder network, and each said switch means comprises a single pole-double throw switch having two contacts and a wiper, one said contact of each said switch being commonly connected to said power supply means, the other said contacts of each said switch being commonly connected to said source of ground potential, said wipers of said switches associated with said magnitude digits being connected to the respective 2R resistors of said ladder network, said wiper of said switch associated with said sign digit being resistively coupled to said other input of said differential circuit.

5. The converter of claim 4 in which said resistance ladder network includes a termination connected to ground potential.

6. The converter of claim 4 in which said resistance ladder network includes a termination connected to said wiper of said switch associated with said sign digit.

* * * * *